United States Patent [19]
Satoh

[11] Patent Number: 6,015,478
[45] Date of Patent: *Jan. 18, 2000

[54] VACUUM PROCESSING METHOD

[75] Inventor: Kazutoshi Satoh, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/805,752

[22] Filed: Feb. 25, 1997

[30] Foreign Application Priority Data

Jun. 7, 1996 [JP] Japan .................................. 8-146286

[51] Int. Cl.$^7$ .................................................. C23C 14/54
[52] U.S. Cl. ............................. 204/192.13; 204/298.03; 427/8; 216/59; 216/60
[58] Field of Search ..................... 204/192.13, 298.03; 427/8; 216/59, 60

[56] References Cited

U.S. PATENT DOCUMENTS 4,172,020  10/1979  Tisone et al. ...................... 204/298.03
4,362,936  12/1982  Hofmann et al. ................... 204/298.03

FOREIGN PATENT DOCUMENTS 7-72307   3/1995   Japan .

*Primary Examiner*—Nam Nguyen
*Assistant Examiner*—Rodney G. McDonald
*Attorney, Agent, or Firm*—Armstrong, Westerman, Hattori, McLeland & Naughton

[57] ABSTRACT

A vacuum processing apparatus includes a process chamber capable of being evacuated and a gas quantity detector for outputting a gas quantity signal corresponding to a partial pressure of each kind of gas contained in the process chamber. The gas quantity detector has a detection sensitivity set in response to a sensitivity calibration signal externally supplied and generates the gas quantity signal at the set detection sensitivity. The gas quantity signal output from the gas quantity detector is obtained. The sensitivity calibration signal is input to the gas quantity detector so that a magnitude of the gas quantity signal for one reference gas selected from gasses contained in the process gas becomes near a target value. Vacuum processing techniques are provided for stably detecting the content of impurity gas by calibrating the sensitivity of the gas quantity detector.

9 Claims, 6 Drawing Sheets

VACUUM PROCESSING METHOD

BACKGROUND OF THE INVENTION a) Field of the Invention

The present invention relates to a vacuum processing method, and more particularly to a vacuum processing method for processing a workpiece by introducing processing gas into a vacuum chamber.

b) Description of the Related Art

Impurity gas in a process chamber of a vacuum processing apparatus such as a vacuum sputtering apparatus has been detected heretofore with a mass analyzer mounted in the process chamber, through differential evacuation of the inside of a sensor of the mass analyzer. Alternatively, a mass analyzer is mounted on a cryopump for evacuating the inside of a process chamber to measure a partial pressure of impurity gas. Abnormal states such as leakage of the vacuum apparatus can be detected by measuring the amount of impurity gas.

A mass analyzer typically uses an amplifier such as a secondary electron multiplier for amplifying small ion current. As the mass analyzer continues to measure gas partial pressure for a long time, the gain of the secondary electron multiplier lowers because of contaminant attached to the secondary electron multiplier or native oxide films or the like formed on the secondary electron multiplier, or the position of a peak detection signal of each mass may shift from a normal position on the mass number coordinate axis.

Such a lowered gain of the secondary electron multiplier or a position shift of a peak detection signal makes difficult to correctly measure a partial pressure of impurity gas.

The partial pressure of impurity gas fluctuates with time. A partial pressure measured with a mass analyzer is an instantaneous value. Therefore, even a momentary abnormal value of a gas partial pressure which does not substantially affect vacuum processing may be detected as an abnormal state of the vacuum processing apparatus.

SUMMARY OF THE INVENTION

It is an object of the present invention to provide vacuum processing techniques allowing to stably measure the content of impurity gas by calibrating the sensitivity of a gas content detector.

It is another object of the present invention to provide vacuum processing techniques allowing to neglect a momentary abnormal value of an impurity gas content and to detect only an abnormal value which substantially affects vacuum processing.

According to one aspect of the present invention, there is provided a vacuum processing apparatus comprising: a process chamber capable of being evacuated; gas introducing means for introducing process gas into said process chamber; a gas quantity detector for outputting a gas quantity signal corresponding to a partial pressure of each kind of gas contained in the process chamber, the gas quantity detector having a detection sensitivity set in response to a sensitivity calibration signal externally supplied and generating the gas quantity signal at the set detection sensitivity; and control means for receiving the gas quantity signal sent from the gas quantity detector and outputting the sensitivity calibration signal to the gas quantity detector so that a magnitude of the gas quantity signal for one reference gas selected from gasses contained in the process gas becomes near a target value.

The sensitivity is calibrated so that the magnitude of the gas quantity signal for the reference gas becomes in an allowable range. A relative concentration of impurity gas in process gas can be measured by monitoring the magnitude of the gas quantity signal of impurity gas in the process chamber.

According to another aspect of the present invention, there is provided a vacuum processing method for vacuum processing an object placed in a process chamber capable of being evacuated, by introducing process gas into the process chamber, comprising: a gas quantity measuring step of measuring a change with time of a quantity of each kind of impurity gas other than the process gas in the process chamber, while the object is vacuum processed; a step of calculating a time average of gas quantities of each kind of impurity gas and obtaining a gas quantity average; and a step of comparing the gas quantity average with a reference value and performing a process corresponding to the comparison results.

Since the average of an impurity gas quantity is compared with the reference value, a momentary increase in the impurity gas quantity can not be detected and an unnecessary alarm or the like can be suppressed.

According to another aspect of the present invention, there is provided a vacuum processing method for vacuum processing an object placed in a process chamber capable of being evacuated, by introducing process gas into the process chamber, comprising: a measuring step of measuring the amount of molecules or atoms of reference gas containing an isotope atom not at a maximum percentage among a plurality of isotope atoms in an element constituting the reference gas contained in the process gas, by using a mass analyzer having a variable sensitivity; and a calibrating step of calibrating the sensitivity of the mass analyzer so as to make the amount measured by the measuring step come near a target value.

The concentration of impurity gas is generally much lower than that of process gas. If one kind of gas in the process gas is used as the reference gas for calibrating the sensitivity of a mass analyzer, the sensitivity for impurity gas becomes too small and it becomes difficult to detect impurity gas. However, if one element contained in the reference gas has a plurality of isotope atoms, the sensitivity of a mass analyzer can be calibrated in accordance with the amount of molecule or atom of reference gas containing an isotope atom not at a maximum percentage among a plurality of isotope atoms, so that impurity gas can be detected easily.

According to another aspect of the present invention, there is provided a vacuum processing method comprising: a processing step of vacuum processing an object placed in a process chamber capable of being evacuated, by introducing process gas into the process chamber, and measuring the content of impurity gas in the process chamber by using a mass analyzer; and a standby process of picking up the processed object from the process chamber and placing an object not processed in the process chamber, wherein in the standby process, if the position of a peak of a detection value for each mass detected with the mass analyzer is shifted from a normal position along a mass coordinate axis, the position of the peak is corrected.

By correcting the peak position shift at each standby step, a correct detection value can be obtained always for each mass.

As above, through automatic calibration of the sensitivity of a gas quantity detector, the impurity gas concentration can be stably monitored. It is also possible to suppress an alarm to be caused by a momentary abnormal value of the impurity gas concentration and to issue an alarm only when there is a possibility of adversely affecting vacuum processing.

DETAILED DESCRIPTION OF THE PREFERRED EMBODIMENTS

Figure 1:
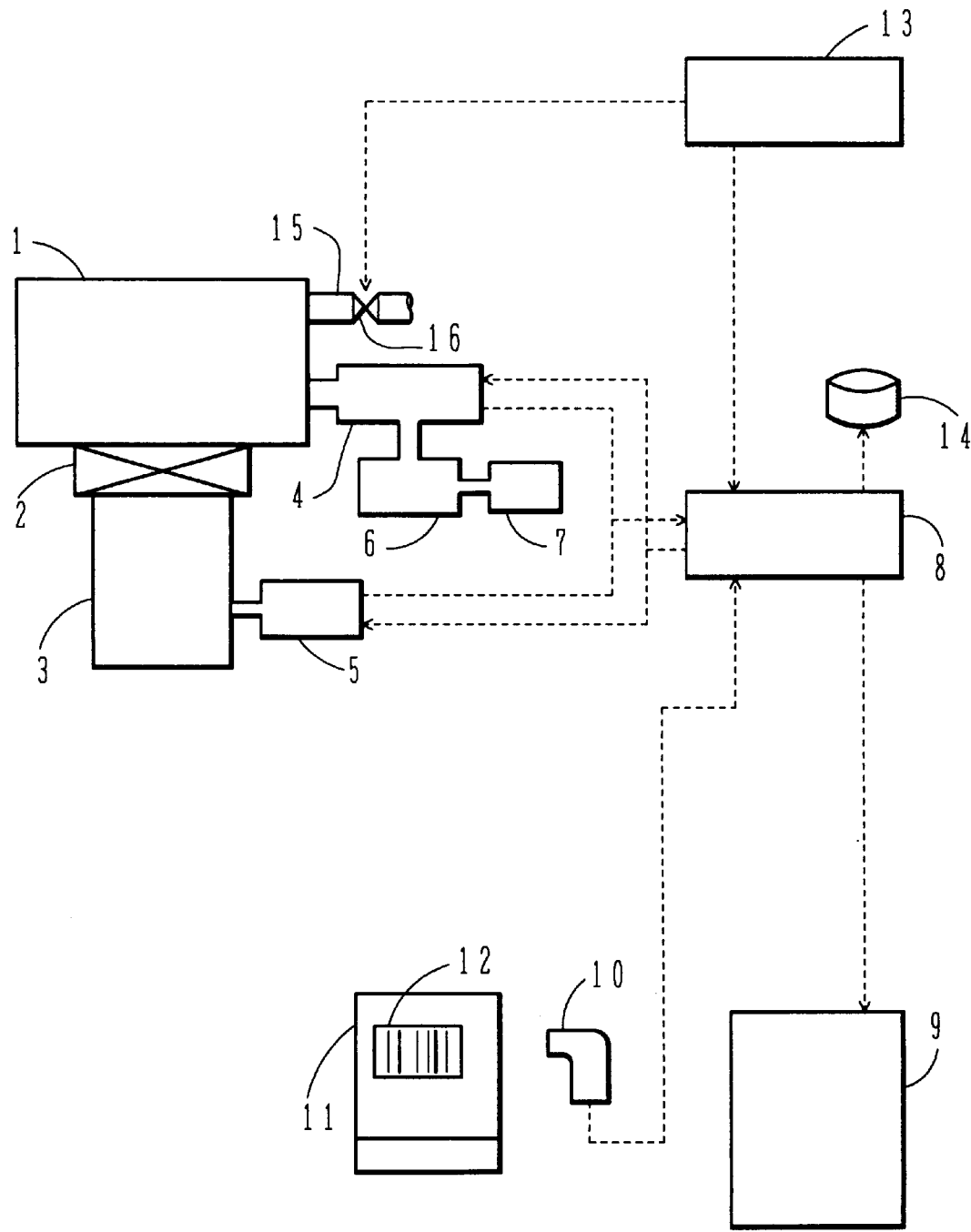
FIG. 1 is a schematic diagram of a vacuum processing apparatus according to an embodiment of the invention.

FIG. 1 is a schematic diagram showing the structure of a sputtering apparatus according to an embodiment of the invention. An airtight process chamber 1 is coupled via a main valve 2 to a cryopump 3 to evacuate the inside of the process chamber 1. A gas pipe 15 communicates with the inside of the process chamber 1 to introduce process gas into the process chamber 1. The inflow amount of the process gas is controlled by a flow control valve 16 connected to the gas pipe 15.

A quadrupole mass analyzer 4 is coupled to the process chamber 1. The inside of the mass analyzer is subjected to differential evacuation by a turbo molecule pump 6. The turbo molecule pump 6 is first roughly evacuated by a roughing vacuum pump 7. The mass analyzer 4 is constituted of an ionizing unit for ionizing gas, a separation unit for separating ionized gas into respective masses, and a secondary electron multiplier to which gasses of respective masses separated by the separation unit are introduced. A gain of the secondary electron multiplier is variably controlled by a sensitivity control signal supplied from a mass analyzer controller 8.

Another mass analyzer 5 is coupled to the cryopump 3 which analyzer measures partial pressures of various gasses in the cryopump 3. The mass analyzer 5 has the structure similar to the mass analyzer 4 and the gain of its secondary electron multiplier is also controlled by the mass analyzer controller 8. Signals corresponding to gas partial pressures measured with the mass analyzers 4 and 5 are supplied to the mass analyzer controller 8.

A controller 13 for the sputtering apparatus adjusts a process gas flow by controlling the flow control valve 16, and sends various signals to be described later to the mass analyzer controller 8.

A bar code reader 10 reads a bar code 12 attached to a wafer carrier 11 which stores a plurality of wafers, the read bar code being supplied to the mass analyzer controller 8.

A storage device 14 has a storage area corresponding to the bar code attached to each wafer carrier 11. The mass analyzer controller 8 stores gas partial pressure information received from the mass analyzers 4 and 5 in the storage area corresponding to the bar code of the wafer carrier 11 under process. The gas partial pressure information is also sent to a host computer 9 which performs concentrated management of the gas partial pressure information.

Figure 2:
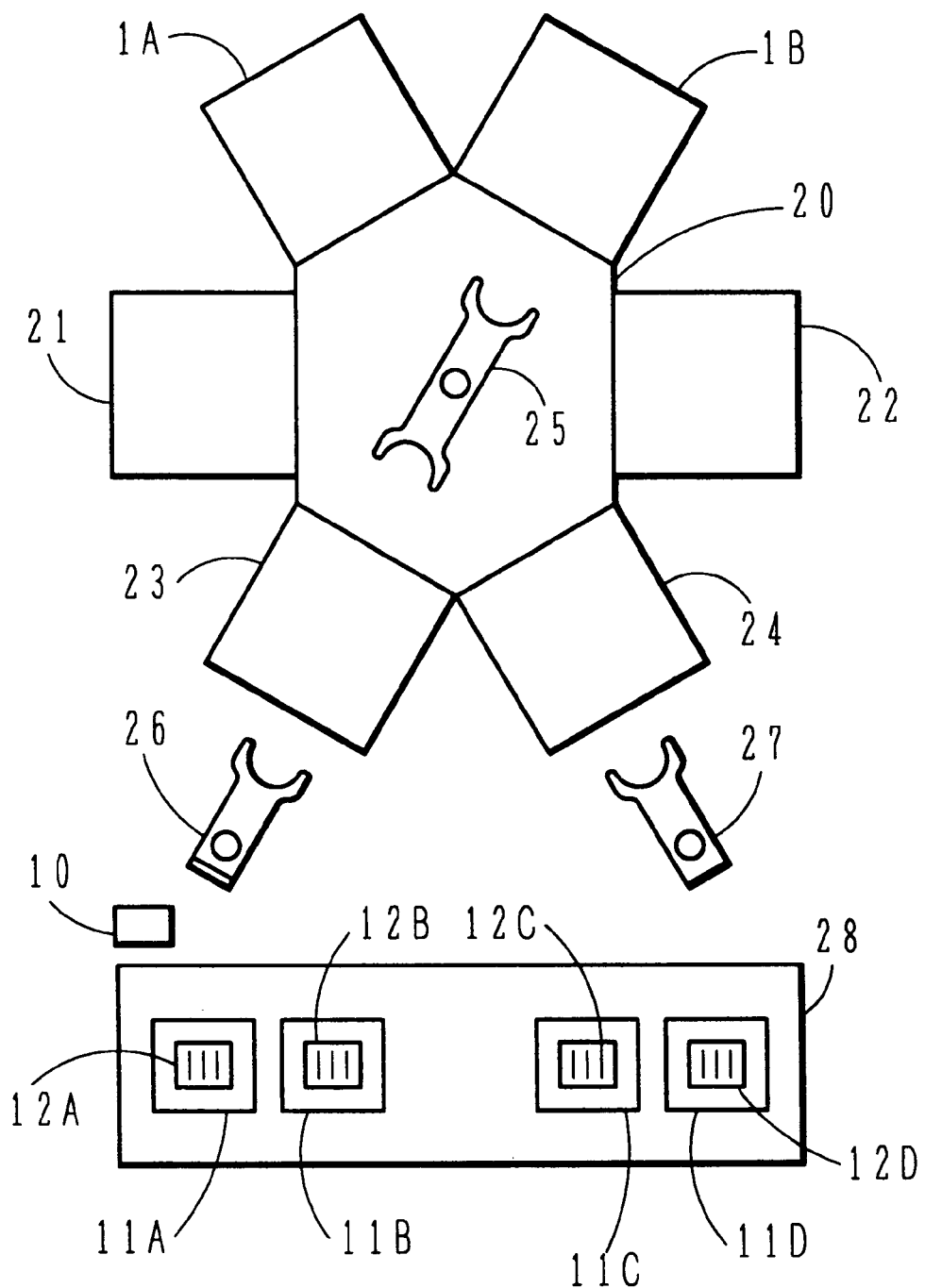
FIG. 2 is a plan view showing the outline of the vacuum processing apparatus shown in FIG. 1.

FIG. 2 is a plan view showing the outline of the sputtering apparatus shown in FIG. 1. Two process chambers 1A and 1B are coupled via gate valves to a transport chamber 20. Also coupled via gate valves to the transport chamber 20 are a preliminary heating chamber 21, a cooling chamber 22, a load lock chamber 23, and an unload lock chamber 24. A robot arm 25 is installed in the transport chamber 20 to transport a process wafer to and from each chamber coupled to the transport chamber 20.

In the process chambers 1A and 1B, films are deposited on the wafers by sputtering. In the preliminary heating chamber 21, the wafer is heated preliminarily before the film is deposited. In the cooling chamber 22, the wafer is cooled down near to the room temperature after the film is deposited.

Wafer carriers 11A and 11B housing wafers to be processed are placed on a wafer carrier stand 28. The wafer carriers 11A and 11B have bar code labels 12A and 12B affixed thereto. The wafer carriers 11A and 11B to be processed are transported into the load lock chamber 23 by a robot arm 26, and during this transport the lot number is read with the bar code reader 10.

Each wafer transported into the load lock chamber 23 is transported into the preliminary heating chamber 21 and pre-heated. The pre-heated wafer is then transported into the process chamber 1A or 1B to deposit a film thereon by sputtering. After this sputtering, the wafer is transported into the cooling chamber 22 and cooled down near to a room temperature. The cooled wafer is housed in a wafer carrier in the unload lock chamber 24.

After all wafers of one lot are processed, the wafer carrier in the unload lock chamber 24 is picked up by a robot arm 27 and placed on the wafer carrier stand 28. Wafer carriers 11C and 11D carry wafers subjected to the sputtering process.

Next, sputtering by the sputtering apparatus shown in FIGS. 1 and 2 will be described with referent to FIGS. 1 to 3. Ar is used as sputtering gas and one of the process chamber 1A and 1B shown in FIG. 2 is used in the following description by way of example. The description of preliminary heating, cooling, and other processes for wafers is omitted.

Figure 3:
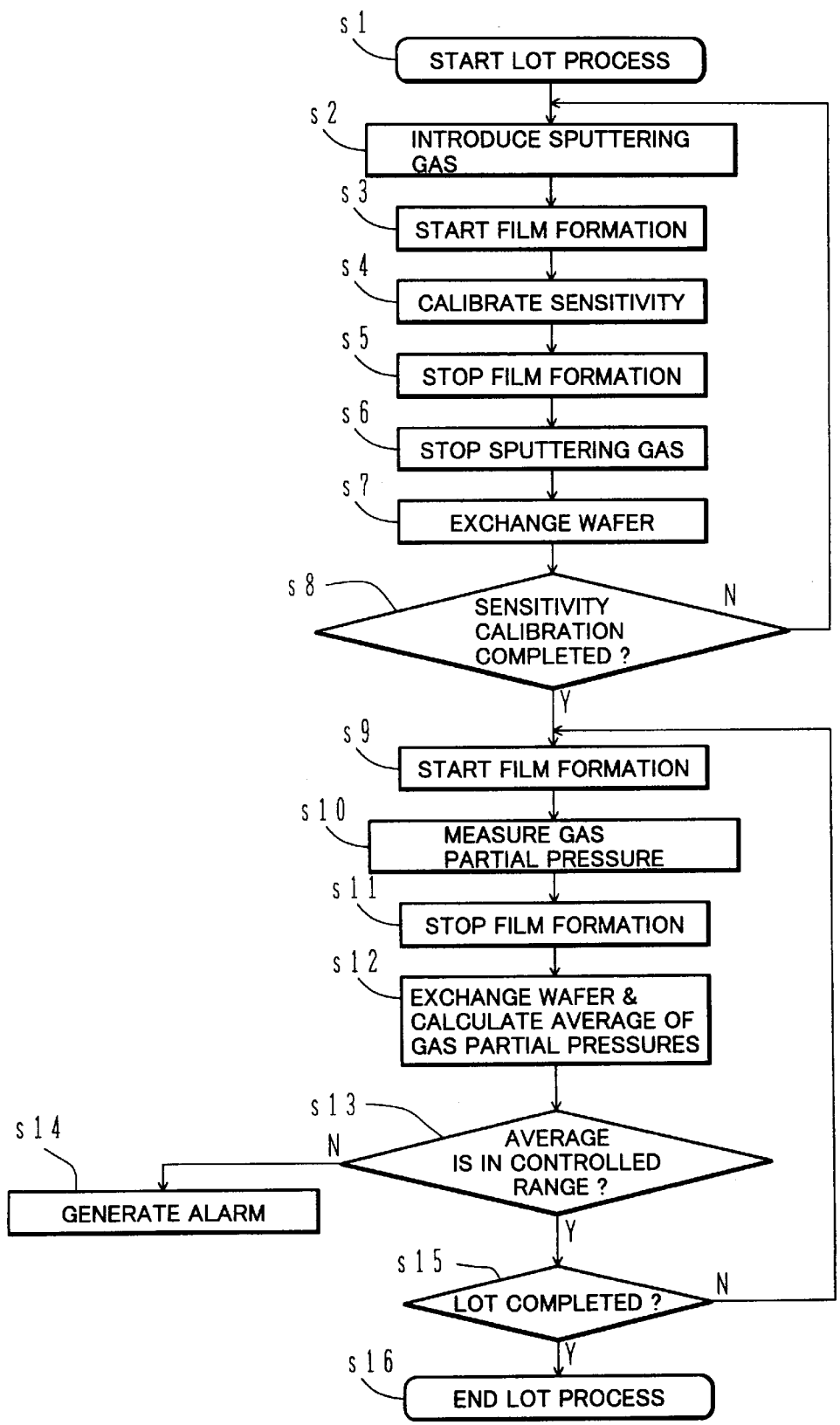
FIG. 3 is a flow chart demonstrating a vacuum processing method according to an embodiment of the invention.

FIG. 3 is a flow chart demonstrating the sputtering process of one lot. At step s1 a lot process starts. For example, one lot has fifty wafers to be processed. These fifty wafers are housed in one wafer carrier 11. The wafer carrier 11 has a bar code label 12 affixed thereto, the bar code label having a bar code representative of a lot identification number.

As the lot process starts, the wafer carrier 11 is transported into the load lock chamber 23 (FIG. 2). At this time, the lot number of the lot to be processed is read with the bar code reader 10. The lot number read with the bar code reader 10 is supplied to the mass analyzer controller 8. The first wafer of the lot is placed in the process chamber 1.

At step s2, the controller 13 manipulates the flow control valve 16 to introduce sputtering gas into the process chamber 1. The controller 13 notifies the mass analyzer controller 8 of the waver number of the first wafer in the process chamber 1. This wafer number is an identification number of each wafer of one lot.

At step s3, plasma is generated in the process chamber to start film formation. The mass analyzers 4 and 5 generate ion currents proportional to respective gas partial pressures in the process chamber 1. The ion current value corresponding to each gas partial pressure is sent to the mass analyzer controller 8.

Figure 4:
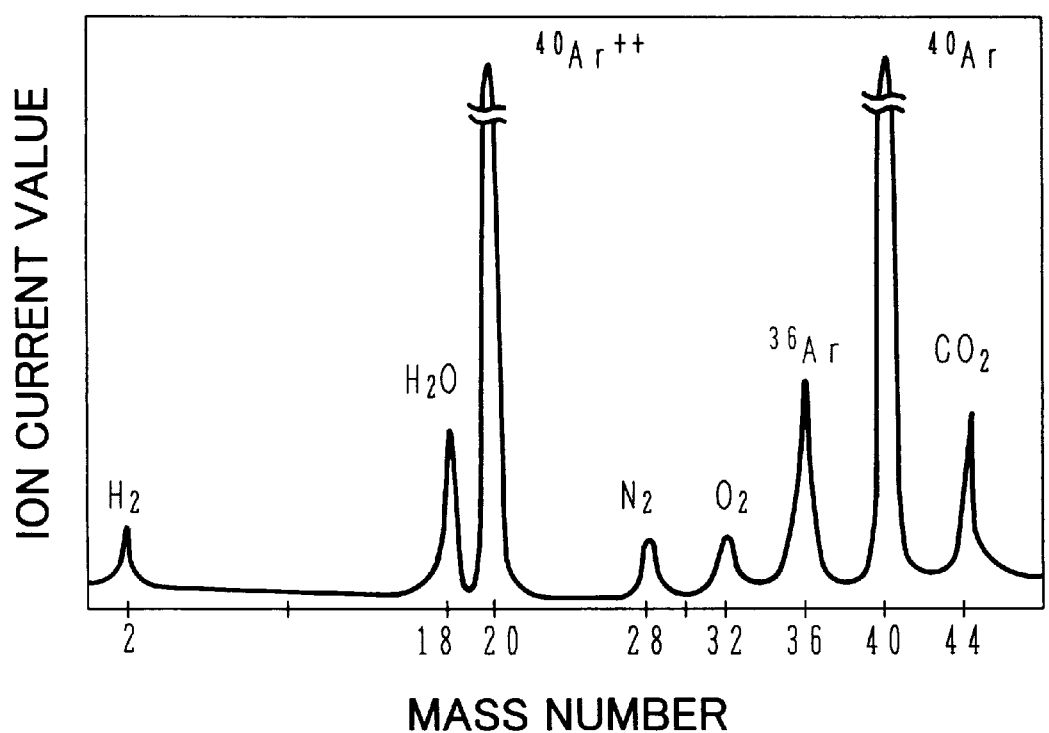
FIG. 4 is a graph illustratively showing the monitor results by the mass analyzer shown in FIG. 1.

FIG. 4 shows an example of the results of gas partial measurements by the mass analyzer 4 or 5. The abscissa represents a mass number of molecule or atom, and the ordinate represents an ion current value in an optional scale corresponding to a gas partial pressure. Peaks appearing at mass numbers 2, 18, 28, 32, and 44 correspond to $H_2$, $H_2O$, $N_2$, $O_2$, and $CO_2$, respectively. Large peaks corresponding to $^{40}Ar$ appear at mass numbers 20 and 40, and a small peak corresponding to $^{36}Ar$ appears at a mass number 36.

A concentration of impurity gas relative to process gas Ar can be measured from the ion current value for the impurity gas obtained when the ion current value for Ar takes a certain target value at the adjusted gain of the mass analyzer. However, the probability of an isotope $^{40}Ar$ is dominant in Ar gas, and the ion current value for $^{40}Ar$ is usually larger than the upper limit of the measurable range of the mass analyzer 4 or 5. Therefore, it is difficult to adjust the sensitivity of the mass analyzer and to measure the concentration of the impurity gas based on $^{40}Ar$ signal.

In this embodiment, the gain of the secondary electron multiplier of the mass analyzer is adjusted so that the ion current value for $^{36}Ar$ takes a certain target value. If the ion current value for an stable isotope contained at a small percentage in process gas having a plurality of atom isotopes is adjusted to take a certain target value, the ion current value for impurity gas can be measured. The probability of $^{36}Ar$ is far less than that of $^{40}Ar$ in Ar gas, and the difference between the ion current values for $^{36}Ar$ and for the impurity gas is not so large. Also, the ion current for $^{36}Ar$ is stable. Therefore, the concentration of impurity gas can be easily measured.

At step s4 shown in FIG. 3, the sensitivities of the mass analyzers 4 and 5 are calibrated so that the ion current value for $^{36}Ar$ takes a certain target value. This sensitivity calibration is executed by sending a sensitivity calibration signal from the mass analyzer controller 8 to the mass analyzers 4 and 5. In response to the received sensitivity calibration signal, the mass analyzers 4 and 5 increase or decrease the gains of the secondary electron multipliers.

The mass analyzer controller 8 stores information corresponding to ion current values at predetermined mass numbers, i.e., information corresponding to partial pressures of impurity gasses, in the storage device 14 at a storage area designated by the wafer number and lot number under process. The information stored in the storage device is referred to, for example, for product inspection after a lot process.

At step s5, plasma is extinguished to stop the film formation. At step s6, introducing the sputtering gas is stopped. Next, at step s7 the wafer deposited with a film is picked up from the process chamber 1 and a new wafer is placed in the process chamber 1. The controller 13 notifies the mass analyzer controller 8 of the wafer number of the new wafer.

At step s8 the ion current value for $^{36}Ar$ immediately before the sputtering gas is stopped being introduced, is compared with the target value. If the measured ion current is equal to the target value or it is in an allowable range, the process advances to step s9, whereas in the other case the process returns to step s2 to execute steps s2 to s7 for the new wafer.

In the above manner, steps s2 to s8 are repeated until the ion current value for $^{36}Ar$ becomes equal to the target value or in the allowable range.

Figure 5A:
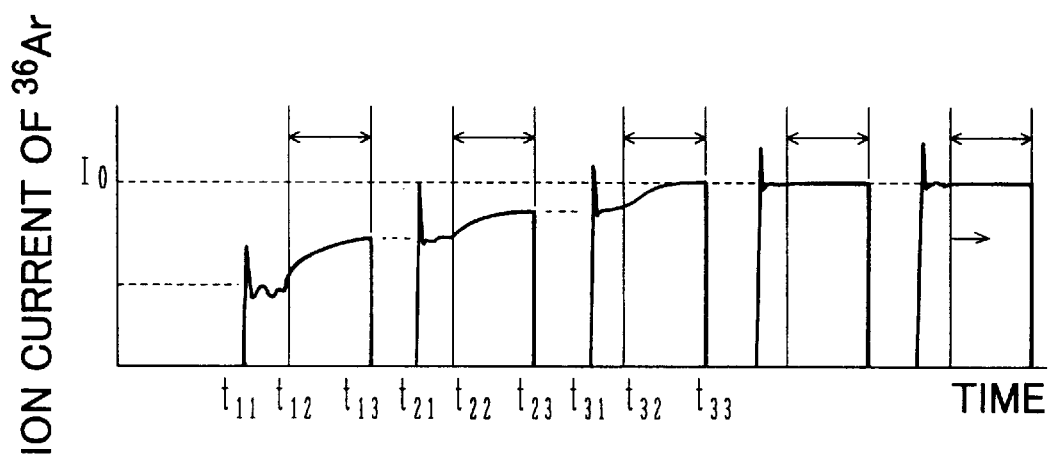
FIGS. 5A and 5B are graphs showing changes with time in the peaks of ion current of $^{36}Ar$ during which the sensitivity of a mass analyzer is calibrated by the embodiment vacuum processing method of this invention.

FIG. 5A shows an example of a change with time of the ion current value for $^{36}Ar$ during the execution of steps s2 to s8. Times $t_{11}$, $t_{21}$, and $t_{31}$ correspond to the introduction of sputtering gas (step s2 in FIG. 3), times $t_{12}$, $t_{22}$, and $t_{32}$ correspond to the start of film formation (step s3), and times $t_{13}$, $t_{23}$, and $t_{33}$ correspond to the ends of film formation (step s5) and sputtering gas introduction (step s6).

During the periods from time $t_{12}$ to time $t_{13}$, from time $t_{22}$ to time $t_{23}$, and from time $t_{32}$ to time $t_{33}$, the sensitivities of the mass analyzers 4 and 5 are calibrated. Therefore, during this sensitivity calibration, the ion current value for $^{36}Ar$ gradually comes to the target value $I_o$. At the time $t_{33}$, the ion current value for $^{36}Ar$ becomes nearly equal to the target value $I_o$. At step s8 of FIG. 3 executed immediately after time $t_{33}$, it is judged whether the sensitivity calibration is completed and the process advances to step s9.

Once the ion current value for $^{36}Ar$ is set in the allowable range of the target value, the sensitivities of the mass analyzers are maintained constant during one lot process.

At step s9 shown in FIG. 3, sputtering gas is introduced into the process chamber 1 to generate plasma and start film formation.

At step s10 the ion current values of impurity gasses are measured. The mass numbers of impurity gasses to be measured are set in advance in the mass analyzer controller 8. Since the ion current value for $^{36}Ar$ is set near to the target value, the ion current value for impurity gas indicates an impurity gas partial pressure relative to the Ar gas partial pressure.

At step s11, plasma is extinguished to terminate film formation and stop introducing the sputtering gas.

At step s12 the wafer with a deposited film is picked up from the process chamber 1 and a new wafer is placed in the process chamber 1. The controller 13 notifies the mass analyzer controller 8 of the wafer number of the new wafer. During the exchange of wafers, a time average of partial pressures of impurity gasses measured at step s10 is calculated for each of impurity gasses.

Figure 6:
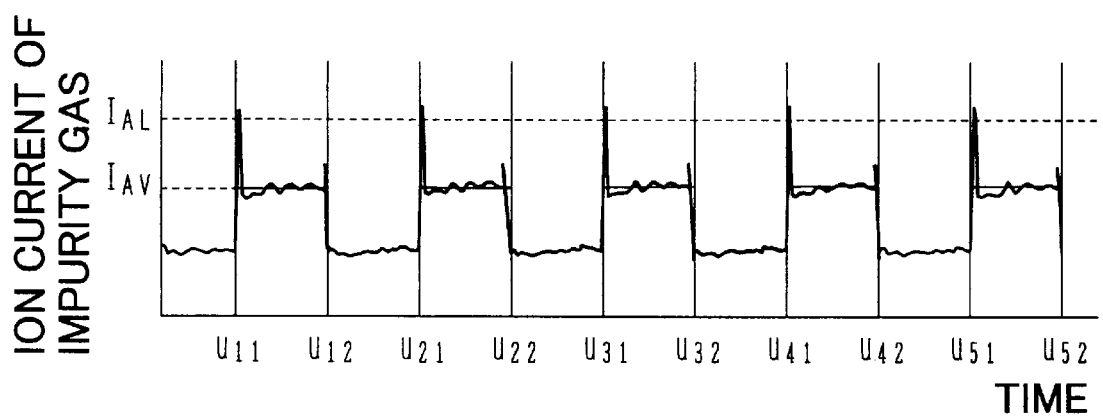
FIG. 6 is a graph showing the monitor results of an impurity gas content obtained by using he embodiment vacuum processing method of this invention.

FIG. 6 shows a change with time of the ion current value of one impurity gas. The period from time $u_{i1}$ to $u_{i2}$ (i=1, 2, ...) corresponds to the period while a film is formed at steps s9 to s11, and the period from time $u_{i2}$ to time $u_{(i+1)1}$ corresponds to the period while wafers are exchanged and the gas partial pressure average is calculated at step s12.

As sputter gas is introduced, for example, at time $u_{11}$, the ion current value for impurity gas momentarily shows a sharp peak. This phenomenon has been confirmed empirically. The width of this peak just after the introduction of sputtering gas is about one second. FIG. 6 shows the peaks higher than an alarm level $I_{AL}$. Thereafter, the gas partial pressure becomes stable while being slightly changed in a certain range. At step s12, during the period from time $u_{11}$ to time $u_{12}$, a time average of ion current value of each impurity gas is calculated to obtain an average $I_{AV}$.

At step s13 shown in FIG. 3 the average $I_{AV}$ is compared with the alarm level $I_{AL}$. If the average $I_{AV}$ is higher than the alarm level $I_{AL}$, the process advances to step s14 to give an alarm. If the average $I_{AV}$ is equal to or lower than the alarm level $I_{AL}$, the flow advances to step s15.

In a usual sputtering process, it is supposed that an increase of an impurity gas concentration in a very short time duration will not adversely affect the film quality. Since the time average of ion current is calculated and compared with the alarm level at step s12, an unnecessary alarm can be suppressed which otherwise is issued in response to a momentary increase of an impurity gas concentration immediately after process gas is introduced as described with FIG. 6.

The width of the peak generated just after the introduction of process gas is empirically about one second. In order to absorb such a peak in the average calculation, it is preferable to set the ion current measurement period for each impurity gas at step s10, to 300 ms or shorter.

At step s15 it is judged whether all wafers of one lot have been processed. If there is a wafer still not processed, steps s9 to s15 are executed for such a wafer. If all wafers of one lot have been processed, the process advances to step s16.

At step s16, the wafer carrier housing fifty processed wafers is picked out from the unload lock chamber 24.

In the above embodiment, the sensitivity calibration of the mass analyzer is performed while the first and following wafers of one lot are processed as illustrated in FIG. 5A. The sensitivity calibration may be performed prior to processing the first wafer and thereafter, the wafers may be processed.

Figure 5B:
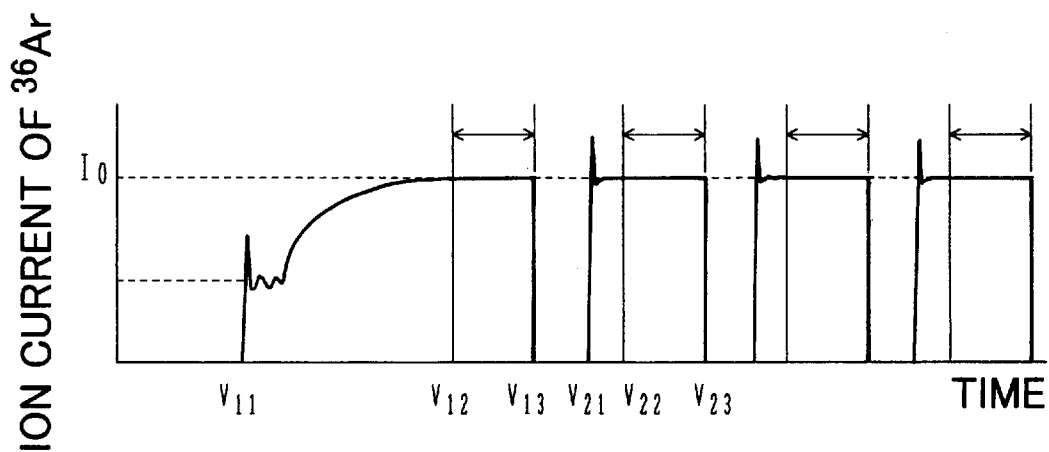

FIG. 5B shows a change with time in the ion current value for $^{36}Ar$ wherein wafers are processed after the sensitivity of the mass analyzer is calibrated. Prior to film formation, sputtering gas is introduced at time $V_{11}$ to perform sensitivity calibration. After the ion current value for $^{36}Ar$ becomes equal to the target value $I_o$, film formation is executed during the period from time $V_{12}$ to time $V_{13}$. The process after time $V_{13}$ is similar to the process after time $t_{33}$ shown in FIG. 5A.

If the sensitivity calibration of the mass analyzer is performed during the wafer processing as illustrated in FIG. 5A, measurement of an amount of impurity gas cannot be made until the peak of the ion current value for $^{36}Ar$ becomes equal to the target value. In contrast, with the method of FIG. 5B, measurement of an amount of impurity gas can be performed starting from the first wafer. However, its throughput becomes lower than the method of FIG. 5A because the wafer processing cannot be performed until the sensitivity calibration is completed.

As the mass analyzer continues to measure partial pressures of impurity gasses for a long time, a peak position of ion current of each mass may shift from a normal position. This peak position shift may result in an inability of measuring a correct amount of impurity gas. It is therefore preferable to correct the peak position shift at step s12 shown in FIG. 3.

In the above embodiment, a film is formed by sputtering. This embodiment may be applied to other vacuum processes using process gas in a vacuum chamber, such as ion implantation, plasma etching, and plasma enhanced CVD.

Also in the above embodiment, although an ion current value for $^{36}Ar$ is used as a reference gas for sensitivity calibration of a mass analyzer, an ion current value for another gas contained in the process gas may be used as a reference gas. In this case, if an isotope contained at a maximum percentage in the reference gas among isotope atoms of each element constituting the reference gas is used as a reference gas, ion current for impurity gas becomes too small or ion current for reference gas becomes too large and the amount of impurity gas becomes difficult to measure. It is therefore preferable to use as the reference gas an isotope contained not at a maximum percentage in the reference gas among isotope atoms of each element constituting the reference gas.

The present invention has been described in connection with the preferred embodiments. The invention is not limited only to the above embodiments. It is apparent that various modifications, improvements, combinations, and the like can be made by those skilled in the art.

I claim:

1. A vacuum processing method using a vacuum processing apparatus comprising a process chamber capable of being evacuated, gas introducing means for introducing a process gas including a plurality of gasses into said process chamber, and a gas quantity detector for outputting a gas quantity signal corresponding to a partial pressure of each of said plurality of gasses contained in the process chamber, said gas quantity detector having a set detection sensitivity set in response to a sensitivity calibration signal externally supplied and generating the gas quantity signal at the set detection sensitivity, said vacuum processing method comprising:

a step of outputting from the gas quantity detector a gas quantity signal of a reference gas, selected from the plurality of gasses contained in the process gas;

a step of generating a sensitivity calibration signal in response to the gas quantity signal of said reference gas sent from said gas quantity detector;

a step of sending the sensitivity calibration signal to said gas quantity detector;

a step of adjusting the sensitivity of the gas quantity detector so that a magnitude of the gas quantity signal for said reference gas reaches a target value.

2. A vacuum processing method according to claim 1, wherein said vacuum processing apparatus further comprises an identification code reader for reading an identification code affixed to an object to be processed and outputting an identification signal corresponding to the identification code, and storage means having a storage area in correspondence with the identification code, and further comprising:

a step when the identification code reader outputs the identification signal;

a step of obtaining the identification signal sent from the identification code reader; and a step of storing gas quantity information for each kind of gas generated in accordance with the gas quantity signal, in said storage means at a storage area corresponding to the identification code designated by the obtained identification signal.

3. A vacuum processing method according to claim 1, wherein said gas quantity detector comprises:

an ionizing unit for producing gas ions in said process chamber;

a separation unit for separating the gas ions into gas ions for respective masses; and a secondary electron multiplier having a gain corresponding to the sensitivity calibration signal for receiving gas ions separated by said separation unit and outputting an electrical signal having an amplitude corresponding to the number of received gas ions.

4. A vacuum processing method according to claim 2, wherein said gas quantity detector comprises:

an ionizing unit for producing gas ions in said process chamber;

a separation unit for separating the gas ions into gas ions for respective masses; and a secondary electron multiplier having a gain corresponding to the sensitivity calibration signal for receiving gas ions separated by said separation unit and outputting an electrical signal having an amplitude corresponding to the number of received gas ions.

5. A vacuum processing method as recited in claim 1 further comprising:
   a gas quantity measuring step of measuring a change with time of a quantity of each kind of impurity gas other than the process gas in the process chamber, while the object is vacuum processed;
   a step of calculating a time average of gas quantities of each kind of impurity gas and obtaining a gas quantity average; and
   a step of comparing the gas quantity average with a reference value and performing a process corresponding to the comparison results.

6. A vacuum processing method according to claim 5, wherein said gas quantity measuring step periodically measures each kind of impurity gas at a period of 300 ms or shorter.

7. A vacuum processing method for vacuum processing an object placed in a process chamber capable of being evacuated, by introducing process gas into the process chamber, comprising:
   measuring the amount of a reference isotope or a reference molecule containing the reference isotope, a relative isotopic abundance of the reference isotope not being of the maximum percentage among a plurality of isotopes in an element constituting a reference gas contained in the process gas, by using a mass analyzer having a variable sensitivity; and
   a calibrating step of adjusting the sensitivity of the mass analyzer so as to make the amount of the reference isotope or the reference molecule measured by said measuring step to reach a target value.

8. A vacuum processing method according to claim 7, wherein said process gas contains Ar, said reference gas is Ar gas, and said measuring step measures the amount of Ar atoms having a mass number of 36.

9. A vacuum processing method comprising:
   a processing step of vacuum processing an object placed in a process chamber capable of being evacuated, by introducing process gas into the process chamber, and measuring the content of impurity gas of the process gas in the process chamber by using a mass analyzer; and
   a standby step of picking up the processed object from the process chamber and placing an object not processed in the process chamber, in said standby step, if the position of a peak of a detection value for each mass detected with the mass analyzer is shifted from a predetermined normal position along a mass coordinate axis, the position of the peak is corrected.

* * * * *